US008922413B1

(12) United States Patent
Yoo

(10) Patent No.: US 8,922,413 B1
(45) Date of Patent: Dec. 30, 2014

(54) AMPLIFIER USING MULTI INPUT DIFFERENTIAL PAIR, AND COMPARATOR AND ANALOG-TO-DIGITAL CONVERTING APPARATUS USING THE SAME

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/052,262

(22) Filed: Oct. 11, 2013

(30) Foreign Application Priority Data

Jun. 14, 2013 (KR) ........................ 10-2013-0068427

(51) Int. Cl.
*H03M 1/12* (2006.01)
*H03M 1/14* (2006.01)
*H03F 3/45* (2006.01)
*H03G 1/00* (2006.01)

(52) U.S. Cl.
CPC ............ *H03M 1/14* (2013.01); *H03F 3/45071* (2013.01); *H03G 1/0017* (2013.01)
USPC .......................................... 341/156; 341/155

(58) Field of Classification Search
CPC .... H03M 1/14; H03F 3/45071; H03G 1/0017
USPC .................. 341/155, 156, 164, 165, 169, 170
See application file for complete search history.

(56) References Cited

U.S. PATENT DOCUMENTS

| 6,670,904 B1 | 12/2003 | Yakovlev |
| 2003/0076172 A1* | 4/2003 | Tichauer ........................ 330/285 |
| 2011/0200070 A1* | 8/2011 | Makinwa et al. .............. 374/170 |

FOREIGN PATENT DOCUMENTS

KR   1020100120749   11/2010

OTHER PUBLICATIONS

Lim, S., et al., A High-Speed CMOS Image Sensor With Column-Parallel Two-Step Single-Slope ADCs, IEEE Transactions on Electron Devices, Mar. 2009, pp. 393-398, vol. 56, No. 3.

* cited by examiner

*Primary Examiner* — Jean B Jeanglaude
(74) *Attorney, Agent, or Firm* — IP & T Group LLP

(57) ABSTRACT

An amplifier includes a common load suitable for outputting an output signal, a coarse input differential stage, coupled to the common load, suitable for amplifying a difference between an input signal and a coarse ramping signal to output a coarse conversion signal as a first output signal, when the coarse ramping signal is lower than the input signal, and a fine input differential stage, coupled to the common load, suitable for amplifying a difference between a fine ramping signal and a bias signal and compensating the first output signal to output a fine conversion signal as the output signal, when a zero crossing occurs by the compensated first output signal.

10 Claims, 2 Drawing Sheets

AMPLIFIER USING MULTI INPUT DIFFERENTIAL PAIR, AND COMPARATOR AND ANALOG-TO-DIGITAL CONVERTING APPARATUS USING THE SAME

CROSS-REFERENCE TO RELATED APPLICATIONS

The present application claims priority of Korean Patent Application No. 10-2013-0068427, filed on Jun. 14, 2013, which is incorporated herein by reference in its entirety.

BACKGROUND

1. Field

Exemplary embodiments of the present invention relate to an image sensor (IS), and more particularly, to a amplifier, which includes a multi input differential stage by employing an additional input differential pair, a comparator, and an analog-to-digital converting apparatus using the same.

In the following embodiments, a two-step single-slope analog-to-digital converter (ADC) will be illustrated, for the illustrative purpose. However, the present invention may be applied to a multi-step multi-slope ADC as well as a multi-step single-slope ADC, and may also be applied to a system requiring a high-speed multi-step single-slope ADC or multi-step multi-slope ADC. Thus, the present invention is not limited to the two-step single-slope ADC.

2. Description of the Related Art

A method for two (multi)-step single-slope A/D conversion were disclosed in related art documents such as U.S. Pat. No. 6,670,904 issued to Alexey Yakovlev on Dec. 30, 2003, entitled as 'Double-Ramp ADC For CMOS Sensors,' and an article by Seunghyun Lim, 'A High-Speed CMOS Image Sensor With Column-Parallel Two-Step Single-Slope ADCs', IEEE Trans. Electron Devices, vol. 56, no. 3, pp. 393-398, March, 2009.

The devices according to the related arts store a coarse ramping voltage for most significant bit (MSB) conversion in a top plate of a capacitor, connect an input stage for fine ramping to a bottom plate of the corresponding capacitor during fine ramping for least significant bit (LSB) conversion, and use the principle that the voltage having been stored in a floating state in the top plate of the capacitor changes according to a fine ramping voltage.

The devices according to the related arts fundamentally may have a concern in that the slopes of the coarse ramping voltage and the fine ramping voltage which are inputted to a comparator during the coarse ramping and the fine ramping may differ depending on a conversion process.

That is, while the coarse ramping voltage may be directly stored in the capacitor and simultaneously transmitted to an input stage of the comparator without a loss, the fine ramping voltage is coupled in series to parasitic capacitance of the input stage of the comparator through the capacitor. Thus, the fine ramping voltage may be transmitted with a loss.

Therefore, the devices according to the related arts do not have a linear output characteristic with respect to an input full range during A/D conversion. That is, a code shift may occur.

SUMMARY

Various exemplary embodiments are directed to a amplifier including a multi input differential pair, that is, a multi input differential stage, and a comparator and an analog-digital converting apparatus using the same.

Also, various exemplary embodiments are directed to a amplifier which includes an additional input differential pair, that is, an input differential stage to increase the number of steps, and a comparator and an analog-to-digital converting apparatus using the same.

In accordance with an exemplary embodiment of the present invention, an amplifier includes a common load suitable for outputting and output signal, a coarse input differential stage, coupled to the common load, suitable for amplifying a difference between an input signal and a coarse ramping signal to output a coarse conversion signal as a first output signal, when the coarse ramping signal is lower than the input signal, and a fine input differential stage, coupled to the common load, suitable for amplifying a difference between a fine ramping signal and a bias signal and compensating the first output signal to output a fine conversion signal as the output signal, when a zero crossing occurs by the compensated first output signal.

In accordance with an exemplary embodiment of the present invention, a comparator includes an amplifier suitable for amplifying a difference between an input signal and a coarse ramping signal as a first output signal when the coarse ramping voltage is lower than the input signal, amplifying a difference between a fine ramping signal and a bias signal and compensating the first output signal to output a fine conversion signal as an output signal when a zero crossing occurs by the compensated first output signal, a signal processing unit suitable for generating a coarse control signal according to the coarse conversion signal from the amplifier, and outputting a comparison signal based on the coarse conversion signal and the fine conversion signal from the amplifier, and a coarse ramping voltage blocking unit suitable for blocking the coarse ramping signal according to the coarse control signal from the signal processing unit.

In accordance with an exemplary embodiment of the present invention, an analog-digital converting apparatus includes an amplifier suitable for amplifying a difference between an input signal and a coarse ramping signal to output a coarse conversion signal as a first output signal when the coarse ramping signal is lower than the input signal, amplifying a difference between a fine ramping signal and a bias signal and compensating the first output signal to output a fine conversion signal as an output signal when a zero crossing occurs by the compensated first output signal, a signal processing unit suitable for generating a coarse control signal according to the coarse conversion signal from the amplifier, and outputting a comparison signal based on the coarse conversion signal and the fine conversion signal from the amplifier, a coarse ramping signal blocking unit suitable for blocking the coarse ramping signal according to the coarse control signal from the signal processing unit, and a code decision unit suitable for deciding a coarse digital code and a fine digital code according to the comparison signal from the signal processing unit and outputting digital pixel data.

DETAILED DESCRIPTION

Figure 1:
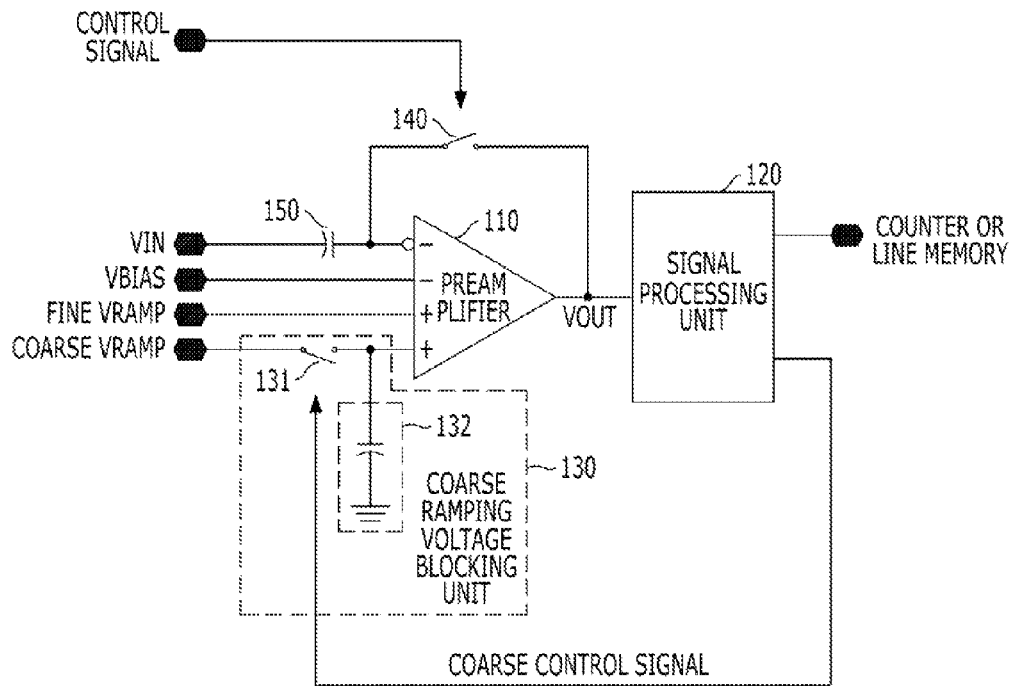
FIG. 1 is a block diagram of a comparator in accordance with an exemplary embodiment of the present invention.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

In this disclosure, when one part is referred to as being 'connected' to another part, it should be understood that the former can be 'directly connected' to the latter, or 'electrically connected' to the latter via an intervening part. Furthermore, when it is described that one comprises (or includes or has) some elements, it should be understood that it may comprise (or include or has) only those elements, or it may comprise (or include or have) other elements as well as those elements if there is no specific limitation. The terms of a singular form may include plural forms unless referred to the contrary.

In order to promote understanding for the embodiments of the present invention, the technical idea of the present invention will be briefly described as follows.

A amplifier in accordance with an exemplary embodiment of the present invention includes a multi-input differential pair. That is, the amplifier in accordance with the exemplary embodiment of the present invention includes an additional input differential pair, that is, an input differential stage to increase the number of steps.

In accordance with the exemplary embodiment of the present invention, ramping voltages for step phases may be accurately reflected into an input of a comparator without a loss caused by a capacitive dividing effect. That is, as a coarse ramping voltage and a fine ramping voltage are directly applied to the input stage of the comparator, it may be possible to prevent a loss which may occur when a sampling capacitor and parasitic capacitance of the comparator input stage are coupled in series. Thus, it may be possible to obtain high-level linearity during A/D conversion.

That is, as the amplifier employs the additional input differential pair, it may be possible to compensate for the imperfection of an existing multi-step single-slope analog-digital converting apparatus in terms of linearity.

FIG. 1 is a block diagram of a comparator in accordance with an exemplary embodiment of the present invention.

Referring to FIG. 1, the comparator in accordance with the exemplary embodiment of the present invention includes a amplifier 110, a signal processing unit 120, and a coarse ramping voltage blocking unit 130. The amplifier 110 is configured to amplify a difference between an input voltage VIN and a coarse ramping voltage COARSE VRAMP and output a coarse conversion result, when the coarse ramping voltage COARSE VRAMP becomes lower than the input voltage VIN. Furthermore, the amplifier 110 serves to amplify a difference between a fine ramping voltage FINE VRAMPFINE VRAMP and a bias voltage VBIAS, compensate for an output voltage obtained by amplifying the difference between the input voltage VIN and the coarse ramping voltage COARSE VRAMP, and output a fine conversion result when zero crossing occurs. The signal processing unit 120 generates a coarse control signal according to the coarse conversion result from the amplifier 110, and outputs a comparison signal based on the coarse conversion result and the fine conversion result from the amplifier 110, to a counter or a line memory. The coarse ramping voltage blocking unit 130 blocks the coarse ramping voltage COARSE VRAMP according to the coarse control signal from the signal processing unit 120.

At this time, the coarse ramping voltage blocking unit 130 includes a switch 131 and a capacitor 132. The switch 131 blocks the coarse ramping voltage COARSE VRAMP according to the coarse control signal from the signal processing unit 120, and the capacitor 132 stores the coarse ramping voltage COARSE VRAMP at the time point at which the switch 131 blocks the coarse ramping voltage COARSE VRAMP.

The comparator may further include a switch 140 for resetting the amplifier 100 according to a control signal. That is, the switch 140 turns on/off the output voltage of the amplifier 110, which is fed back to an input terminal to receive the input voltage VIN, according to a control signal from an external controller (not illustrated), thereby resetting the amplifier 110.

The comparator may further include a capacitor 150 configured to decouple the input voltage VIN, which is to be A/D converted, from the output voltage fed back from the amplifier 100.

The detailed configuration and operation of the comparator will be described with reference to FIGS. 2 to 4.

Figure 2:
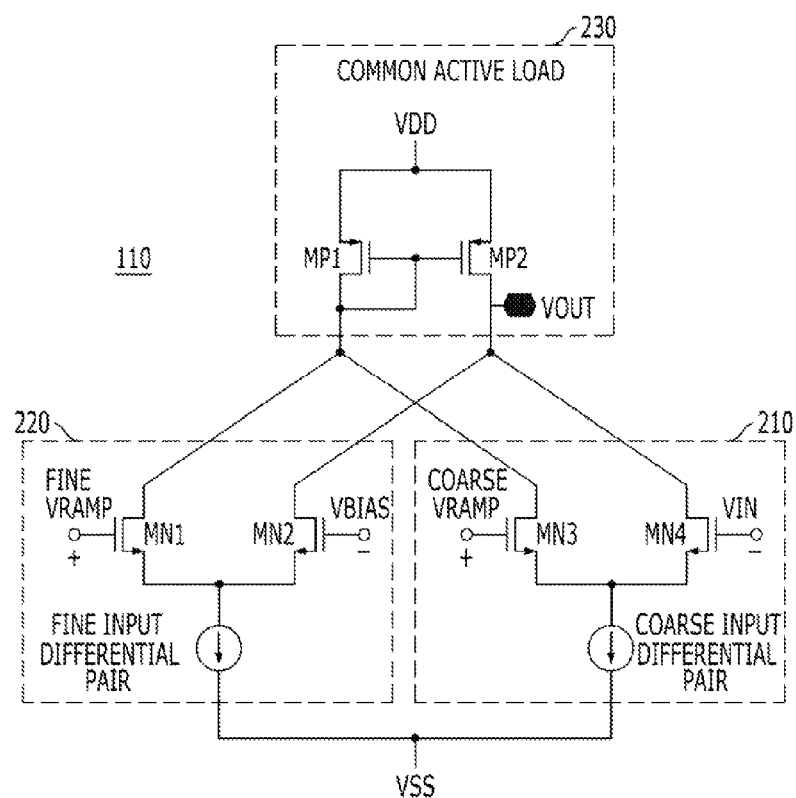
FIG. 2 is a detailed circuit diagram of a amplifier shown in FIG. 1.

FIG. 2 is a detailed circuit diagram of the amplifier 110 of FIG. 1.

Referring to FIG. 2, the amplifier in accordance with the exemplary embodiment of the present invention includes a common active load 230, a coarse input differential pair 210, and a fine input differential pair 220. The common active load 230 serves as an output stage to output a coarse conversion result and a fine conversion result. The coarse input differential pair 210 is configured to amplify a difference between the input voltage VIN and the coarse ramping voltage COARSE VRAMP and output a coarse conversion result through the output stage, when the coarse ramping voltage COARSE VRAMP becomes lower than the input voltage VIN. The fine input differential pair 220 serves to amplify a difference between the fine ramp voltage FINE VRAMPFINE VRAMP and the bias voltage VBIAS, compensate for the output voltage obtained by amplifying the difference between the input voltage VIN and the coarse ramping voltage COARSE VRAMP, and output a fine conversion result through the output stage when a zero crossing occurs.

Referring to FIG. 2, the configuration and operation of the amplifier 110 will be described in detail as follows.

The input differential pair, that is, the input differential stage is divided into multi-steps for coarse conversion and fine conversion. That is, first and second transistors MN1 and MN2 form the fine input differential pair 220 for the fine conversion, and third and fourth transistors MN3 and MN4 form the coarse input differential pair 210 for the coarse conversion.

At this time, the coarse input differential pair 210 directly receives the input voltage VIN and the coarse ramping voltage COARSE VRAMP and compares the received voltages. Then, as soon as the coarse ramping voltage COARSE VRAMP becomes lower than the input voltage VIN, the coarse conversion result obtained by amplifying the difference between the input voltage VIN and the coarse ramping voltage COARSE VRAMP is outputted to an output terminal VOUT of the common active load 230, and transmitted to the signal processing unit 120. The coarse input differential pair 210 may be referred to as a coarse input differential stage.

The fourth transistor MN4 of the coarse input differential pair 210 has a gate terminal to receive the input voltage VIN which is to be A/D converted, and the third transistor MN3 has a gate terminal to directly receive the coarse ramping voltage COARSE VRAMP.

The fine input differential pair 220 amplifies a difference between the fine ramp voltage FINE VRAMPFINE VRAMP and the bias voltage VBIAS, compensates for the output voltage obtained by amplifying the difference between the input voltage VIN and the coarse ramping voltage COARSE VRAMP, and output a fine conversion result to the signal processing unit 120 through the output terminal VOUT of the common active load 230 when a zero crossing occurs. At this time, the same voltage as a starting level of the fine ramping voltage FINE VRAMPFINE VRAMP is used as the bias voltage VBIAS. The fine input differential pair 220 may be referred to as a fine input differential stage.

The first transistor MN1 of the fine input differential pair 220 has a gate terminal to directly receive the fine ramping voltage FINE VRAMPFINE VRAMP, and the second transistor MN2 has a gate terminal to directly receive the bias voltage VBIAS having the same level as the starting level of the fine ramping voltage FINE VRAMPFINE VRAMP.

The differential amplification operations of the fine differential input pair 220 including the first and second transistors MN1 and MN2 and the coarse differential input pair 210 including the third and fourth transistors MN3 and MN4 are well-known to those skilled in the art. Thus, the detailed descriptions thereof are omitted herein. Furthermore, the common active load 230 including two transistors MP1 and MP2 serves as an output stage. Since the configuration and operation of the command active load 230 are well-known to those skilled in the art, the detailed descriptions thereof are omitted herein.

Figure 3:
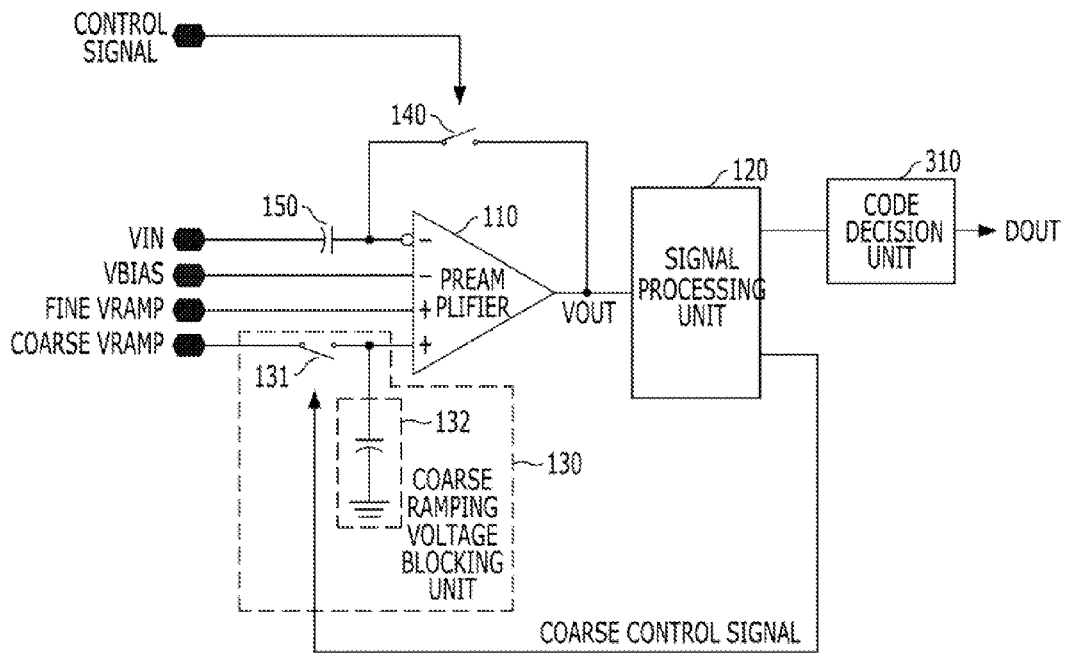
FIG. 3 is a block diagram of an analog-to-digital converting apparatus in accordance with an exemplary embodiment of the present invention.

FIG. 3 is a block diagram of an analog-digital converting apparatus in accordance with an exemplary embodiment of the present invention.

Referring to FIG. 3, the analog-digital converting apparatus in accordance with the exemplary embodiment of the present invention includes the comparator of FIG. 1 and a code decision unit 310.

That is, the analog-digital converting apparatus in accordance with the embodiment of the present invention includes the amplifier 110, the signal processing unit 120, the coarse ramping voltage blocking unit 130, and the code decision unit 310. The amplifier 110 is configured to amplify a difference between an input voltage VIN and a coarse ramping voltage COARSE VRAMP and output a coarse conversion result, when the coarse ramping voltage COARSE VRAMP becomes lower than the input voltage VIN. Furthermore, the amplifier 110 is configured to amplify a difference between a fine ramping voltage FINE VRAMPFINE VRAMP and a bias voltage VBIAS, compensate for an output voltage obtained by amplifying the difference between the input voltage VIN and the coarse ramping voltage COARSE VRAMP, and output a fine conversion result when zero crossing occurs. The signal processing unit 120 is configured to generate a coarse control signal according to the coarse conversion result from the amplifier 110, and output a comparison signal based on the coarse conversion result and the fine conversion result from the amplifier 110. The coarse ramping voltage blocking unit 130 serves to block the coarse ramping voltage COARSE VRAMP according to the coarse control signal from the signal processing unit 120. The code decision unit 310 is configured to decide a coarse digital code and a fine digital code according to the comparison signal from the signal processing unit 120, and output digital pixel data DOUT.

The code decision unit 310 may include a counter, for example, an up/down counter, or a line memory to receive a counting value. The other components are configured as described with reference to FIGS. 1 and 2, and specific operations thereof will be described in detail with reference to FIG. 4.

Figure 4:
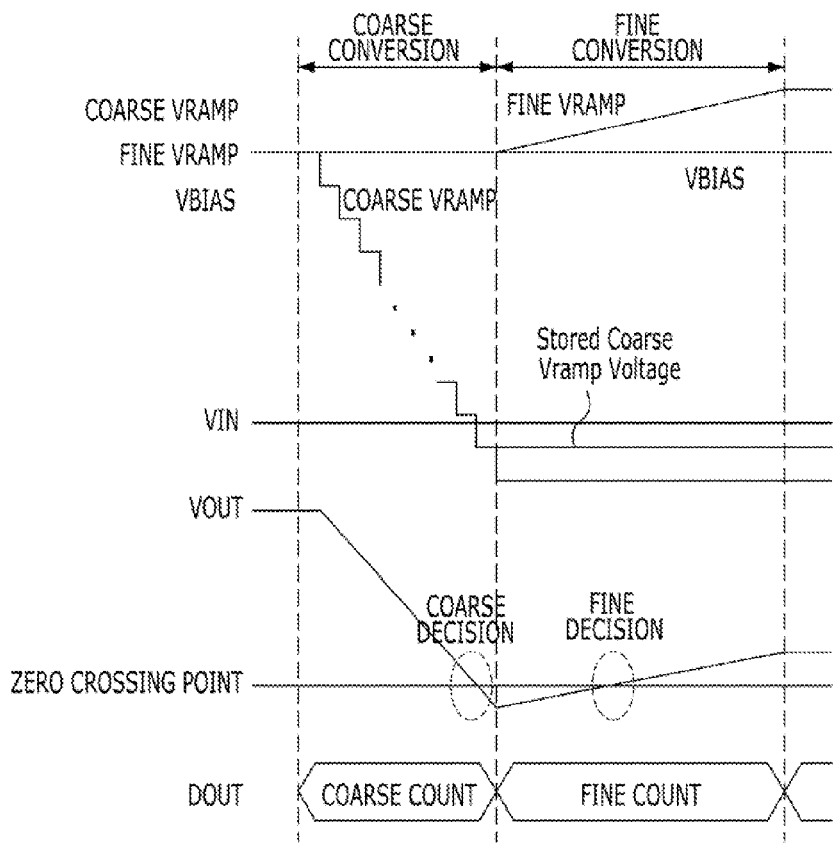
FIG. 4 is a timing diagram of the amplifier, the comparator, and the analog-to-digital converting apparatus in accordance with the exemplary embodiment of the present invention.

FIG. 4 is a timing diagram of the amplifier, the comparator, and the analog-digital converting apparatus in accordance with the exemplary embodiment of the present invention.

At a first step, the coarse input differential pair 210 compares the input voltage VIN and the coarse ramping voltage COARSE VRAMP. When the coarse ramping voltage COARSE VRAMP is lower than the input voltage VIN, a difference between the input voltage VIN and the coarse ramping voltage COARSE VRAMP is amplified and outputted to the output terminal VOUT of the amplifier 110, that is, the output terminal VOUT of the common active load 230, and then transmitted to the signal processing unit 120.

According to the output voltage at this time, the signal processing unit 120 generates the coarse control signal to turn off the switch 131 through which the coarse ramping voltage COARSE VRAMP passes. Then, the coarse ramping voltage COARSE VRAMP at this time is stored in the capacitor 132 serving as the input stage of the comparator. Simultaneously, the signal processing unit 120 transmits the comparison signal to a counter positioned in a column or a line memory receiving a counting value so as to decide a coarse digital code.

At a second step, as the fine ramping voltage FINE VRAMPFINE VRAMP is changed, the absolute value of the voltage outputted by amplifying the difference between the input voltage VIN and the coarse ramping voltage COARSE VRAMP gradually decreases, and a zero crossing occurs. At this time, the output voltage is transmitted to the signal processing unit 120 through the output terminal VOUT of the amplifier 110, that is, the output terminal VOUT of the common active load 230. Then, the signal processing unit 120 transmits the comparison signal to a counter positioned in a column or a line memory receiving a counting value so as to decide a fine digital code.

That is, the fine input differential pair 220 amplifies a difference between the fine ramping voltage and the bias voltage having the same level as the starting level of the fine ramping voltage, and compensates for the output voltage amplified at the coarse conversion phase, thereby causing a zero crossing.

In accordance with the exemplary embodiment of the present invention, the full range of the fine conversion precisely coincides with the LSB of the coarse conversion. Thus, linearity may be maintained with respect to the input full range.

As the above-described steps are performed multiple times, the multi-step single-slope A/D conversion may be realized.

In accordance with the exemplary embodiment of the present invention, as the amplifier employs the additional input differential pair, it may be possible to solve the concern that the ramp slopes of voltages inputted to the comparator during coarse ramping and fine ramping may differ depending on the step phase.

That is, as the coarse ramping voltage and the fine ramping voltage are directly applied to the input stage of the amplifier, it may be possible to prevent a loss which may occur when the sampling capacitor and the parasitic capacitance of the amplifier input stage are coupled in series.

The above-described embodiments of the present invention may be used as a core technique for implementing a high frame rate CMOS image sensor (CIS). That is, a variety of techniques may be used to implement the high frame rate CMOS image sensor. In particular, the embodiments of the present invention may be used to implement a multi-step single-slope analog-digital converting apparatus or multi-step multi-slope analog-digital converting apparatus.

Furthermore, the embodiments of the present invention may be applied to a system requiring a high-speed multi-step single-slope analog-digital converting apparatus or a multi-step multi-slope analog-digital converting apparatus or similar application systems, in addition to the CIS field.

Although various embodiments have been described for Illustrative purposes, it will be apparent to those skilled in the art that various changes and modifications may be made without departing from the spirit and scope of the invention as defined in the following claims.

What is claimed is:

1. An amplifier comprising:
   a common load suitable for outputting an output signal;
   a coarse input differential stage, coupled to the common load, suitable for amplifying a difference between an input signal and a coarse ramping signal to output a coarse conversion signal as a first output signal, when the coarse ramping signal is lower than the input signal; and
   a fine input differential stage, coupled to the common load, suitable for amplifying a difference between a fine ramping signal and a bias signal and compensating the first output signal to output a fine conversion signal as the output signal, when a zero crossing occurs by the compensated first output signal.

2. The amplifier of claim 1, wherein the fine input differential stage comprises:
   a first transistor having a gate terminal suitable for directly receiving the fine ramping signal; and
   a second transistor having a gate terminal suitable for directly receiving the bias signal having the same level as a starting level of the fine ramping signal.

3. The amplifier of claim 2, wherein the coarse input differential stage comprises:
   a third transistor having a gate terminal suitable for directly receiving the coarse ramping signal; and
   a fourth transistor having a gate terminal suitable for directly receiving the input signal which is to be analog-to-digital (A/D) converted.

4. A comparator comprising:
   an amplifier suitable for amplifying a difference between an input signal and a coarse ramping signal to output a coarse conversion signal as a first output signal when the coarse ramping signal is lower than the input signal, amplifying a difference between a fine ramping signal and a bias signal and compensating the first output signal to output a fine conversion signal as an output signal when a zero crossing occurs by the compensated first output signal;
   a signal processing unit suitable for generating a coarse control signal according to the coarse conversion signal from the amplifier, and outputting a comparison signal based on the coarse conversion signal and the fine conversion signal from the amplifier; and
   a coarse ramping signal blocking unit suitable for blocking the coarse ramping signal according to the coarse control signal from the signal processing unit.

5. The comparator of claim 4, wherein the amplifier comprises:
   a common load suitable for outputting the output signal to the signal processing unit;
   a coarse input differential stage, coupled to the common load, suitable for amplifying a difference between the input signal and the coarse ramping signal to output the coarse conversion signal as the first output signal, when the coarse ramping signal is smaller than the input signal; and
   a fine input differential stage, coupled to the common load, suitable for amplifying a difference between the fine ramping signal and the bias signal and compensating the first output signal to output the fine conversion signal as the output signal, when a zero crossing occurs by the compensated first output signal.

6. The comparator of claim 4, wherein the coarse ramping signal blocking unit comprises:
   a switch suitable for blocking the coarse ramping signal according to the coarse control signal from the signal processing unit; and
   a capacitor suitable for storing the coarse ramping signal at the time point at which the switch blocks the coarse ramping signal.

7. The comparator of claim 4, wherein the comparator further comprises a switch suitable for resetting the amplifier according to a control signal.

8. The comparator of claim 4, wherein the comparator further comprises a capacitor suitable for decoupling an input signal, which is to be A/D converted, from the output signal fed back from the amplifier.

9. An analog-digital converting apparatus comprising:
   an amplifier by suitable for amplifying a difference between an input signal and a coarse ramping signal to output a coarse conversion signal as a first output signal when the coarse ramping signal is lower than the input signal, amplifying a difference between a fine ramping signal and a bias signal and compensating the first output signal to output a fine conversion signal as an output signal when a zero crossing occurs by the compensated first output signal;
   a signal processing unit suitable for generating a coarse control signal according to the coarse conversion signal from the amplifier, and outputting a comparison signal based on the coarse conversion signal and the fine conversion signal from the amplifier;
   a coarse ramping signal blocking unit suitable for blocking the coarse ramping signal according to the coarse control signal from the signal processing unit; and
   a code decision unit suitable for deciding a coarse digital code and a fine digital code according to the comparison signal from the signal processing unit and outputting digital pixel data.

10. The analog-digital converting apparatus of claim 9, wherein the amplifier comprises:
    a common load suitable for outputting the output signal to the signal processing unit;
    a coarse input differential stage, coupled to the common load, suitable for amplifying a difference between the input signal and the coarse ramping signal to output the coarse conversion signal as the first output signal, when the coarse ramping signal is smaller than the input signal; and
    a fine input differential stage, coupled to the common load, suitable for amplifying a difference between the fine ramping signal and the bias signal and compensating the first output signal to output the fine conversion signal as the output signal, when a zero crossing occurs by the compensated first output signal.

* * * * *